United States Patent [19]

Albritton

[11] 4,223,307
[45] Sep. 16, 1980

[54] DELAYED POWER INTERRUPTION ALARM

[76] Inventor: James W. Albritton, 1611 SE 40th St., Cape Coral, Fla. 33904

[21] Appl. No.: 940,257

[22] Filed: Sep. 7, 1978

[51] Int. Cl.² ........................................... G08B 21/00
[52] U.S. Cl. ................................. 340/656; 340/309.2
[58] Field of Search ............ 340/507, 652, 656, 309.1, 340/309.2

[56] References Cited

U.S. PATENT DOCUMENTS 2,632,887  3/1953  Rusnak ................................. 340/656

FOREIGN PATENT DOCUMENTS 804773  1/1969  Canada .................................... 340/656

Primary Examiner—Alvin H. Waring

Attorney, Agent, or Firm—Krass & Young

[57] ABSTRACT

An alarm device indicates the occurrence of a power failure or other interruption of power supplied to businesses or residences which triggers the alarm indication only after the elapse of a predetermined adjustable delay interval commencing upon the occurrence of the power failure. The device includes a mechanically-operated timer-alarm device, the operation of which is controlled by a lock and release lever, with the lever position in turn controlled by an electrically-operated solenoid plugged into the circuit to be monitored. As long as the circuit supplies power to the solenoid, release of the timer is prevented. Upon occurrence of a power failure, the release of the lock and release enables the timer to begin timing out intervals of a preselected duration, after which the alarm is sounded.

4 Claims, 4 Drawing Figures

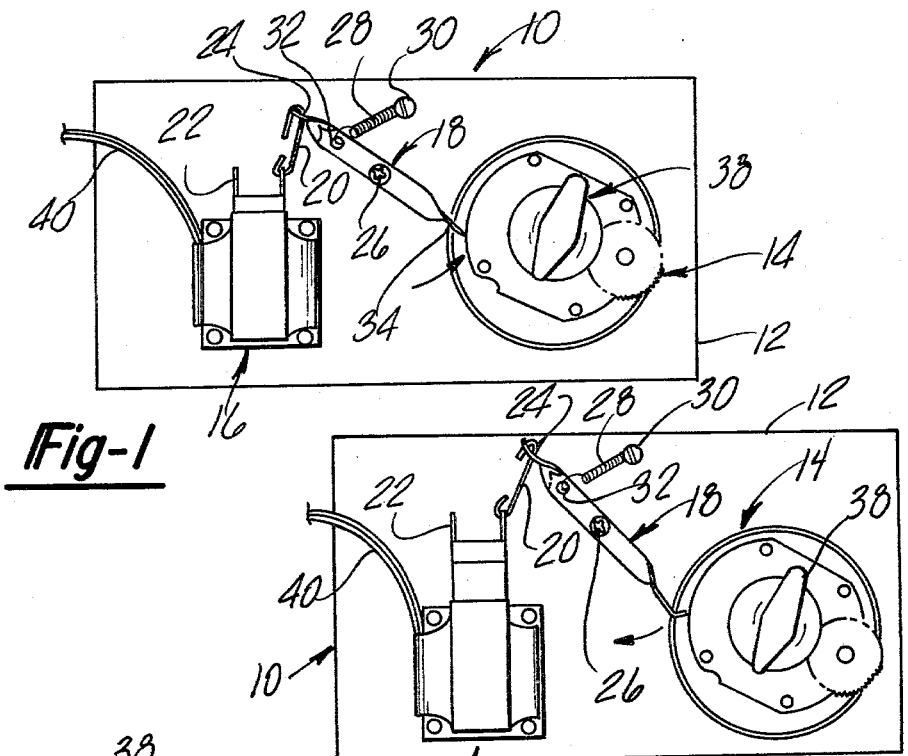
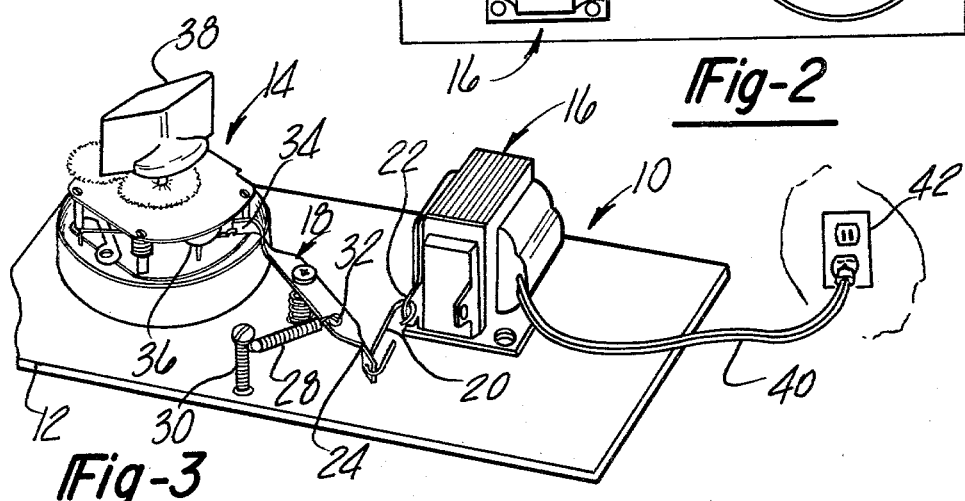
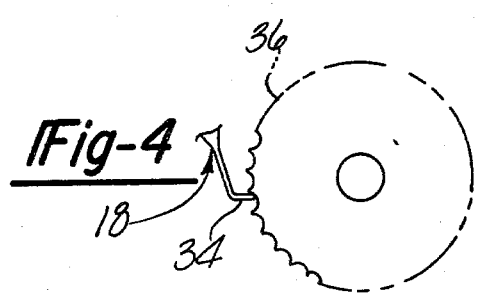

DELAYED POWER INTERRUPTION ALARM

BACKGROUND DISCUSSION

In many instances, it is highly important that homeowners and operators of commercial establishments be promptly made aware of the occurrence of a power failure since considerable damage or property loss may occur if the power failure continues for extended lengths of time. If the proprietor or homeowner is alerted, emergency power generating equipment could be pressed into service or other steps taken to reduce the incidence of damage or loss of perishables.

These circumstances, for example, include the shutdown of refrigerators, freezers, and/or the interruption of service of sump pumps. If the power failure occurs at night, the homeowner may remain unaware of the power failure until a considerable lapse of time has transpired and the damage or loss already occurred.

At the same time, many instances of interruption of service are relatively short in duration such that damage or loss would not occur and, accordingly, an alarm system for monitoring such failures would desirably not sound until after the failure has persisted for some time after which preventive steps should be taken.

U.S. Pat. Nos. 4,001,803 and 3,958,212 both disclose typical prior art power failure alarms. These arrangements disclose a coil used to hold an alarm device in the inoperative position, which hold-in device is powered by the circuit to be monitored, thus upon interruption of the power, the alarm is sounded.

However, this results in the sounding of the alarm for even momentary power interruptions such as to create unnecessary disturbances and the necessity to reset the device. Particularly, this is so since these interruptions could occur at relatively inconvenient times such as during the nighttime.

An additional disadvantage of this approach is the necessity for an auxiliary power source, i.e., batteries, to power the alarm. Batteries degenerate with time and it is possible that the relatively long intervals of time during which the device would not get attention could very well lead to the failure of the device when needed.

U.S. Pat. Nos. 3,588,856 and 1,999,811 disclose alarm arrangements for circuitry which incorporates delays. These appear to allow for a slight delay before the activation of the alarm device is produced and do not appear to interpose delays of sufficient duration to be applicable to the situation described above. In addition, these arrangements are relatively complex and not well suited to use by the homeowner.

Accordingly, it is an object of the present invention to provide a power failure monitor or alarm which provides an alarm indication in the event of a power failure in the circuit to be monitored, but only after a predetermined adjustable delay of sufficient duration to eliminate giving false alarm conditions. That is, only upon continuance of the power failure or interruption for an interval of sufficient length is the alarm given such that steps may be taken to protect property endangered by the power failure.

It is another object of the present invention to provide such a power failure monitor which does not depend on auxiliary power sources such as batteries, but which is self-contained so as to be relatively reliable in operation.

It is yet another object of the present invention to provide such a power failure alarm which is simple and reliable in operation and which may be manufactured at relatively low cost.

SUMMARY OF THE INVENTION

These and other objects of the present invention, which will become apparent upon a reading of the following specification and claims, are achieved by the use of a mechanically-operated timer-alarm which sounds an alarm upon the elapse of a predetermined adjustable interval after activation of the timer. The actuation of the timer in turn is controlled by an electrical solenoid which serves to position a lock and release lever movable to a position to restrain release of the timer as long as power is supplied to the solenoid, but which is spring-biased outwardly to release the timer upon de-energization of the solenoid. The solenoid in turn is powered by the circuit being monitored such that upon the occurrence of a power failure, the solenoid is released and the lock and release lever moves to the release position and the timer begins to time-out.

DESCRIPTION OF THE DRAWINGS

FIG. 1 is a plan view of the alarm device according to the present invention with the outer housing removed to show the main operating components prior to the occurrence of a power failure.

FIG. 2 is a plan view of the alarm device shown in FIG. 1 depicting the components after a power interruption has occurred.

FIG. 3 is a perspective view of the alarm device shown in FIGS. 1 and 2.

FIG. 4 is a plan view of the timer gear and a portion of the lever shown in FIG. 3.

DETAILED DESCRIPTION

In the following detailed description, certain specific terminology will be utilized for the sake of clarity and a particular embodiment described in accordance with the requirements of 35 USC 112, but it is to be understood that the same is not intended to be limiting and should not be so construed inasmuch as the invention is capable of taking many forms and variations within the scope of the appended claims.

Referring to the drawings, the alarm device 10, according to the present invention, includes a base plate 12 to which is mounted the various components. A cover or housing would normally enclose these, but is shown removed to reveal the details of the components.

These components include a mechanically-operated, spring-wound timer-alarm 14, electrical operator means including an electrical solenoid 16 and a pivoted lock and release lever 18.

The solenoid 16 is linked to the lock and release lever 18 by a link 20 joined at one end to the plunger 22 of the solenoid 16 and at the other end to one end of the lock and release lever 18.

The lock and release lever 18 is pivoted at 26 such as to be rotated in a counterclockwise direction upon energization of the solenoid 16 to be maintained in the position shown in FIG. 1. This movement is against the bias of an extension spring 28 secured at one end to a mounting post 30 and at the other end to a mounting opening 32 formed in the lock and release lever 18.

The opposite end of the lock and release lever 18 is formed with a blade end 34 which is engaged with a gear 36 normally forming a part of the timer-alarm 14, such that as long as the lock and release lever 18 is in the position shown in FIG. 1, the timer-alarm 14 is prevented from operating.

The timer-alarm 14 may be of a conventional design such as used for kitchen timers and comprises a selector handle 38, the rotation of which serves to allow adjustment of the predetermined time of operation of the timer-alarm 14, since after release, the alarm is sounded only after the elapse of a predetermined interval.

The solenoid 16 is maintained in an energized condition by the power cord 40 which may be plugged into an A.C. outlet 42 in the circuit of which the power is to be monitored.

Accordingly, if the power is interrupted in that circuit, the solenoid 16 is released and the lock and release lever 18 rotated clockwise by the extension spring 28, moving the lock and release lever 18 to the release position.

When power is restored in the circuit, the lock and release lever 18 is again moved to the position shown in FIG. 1 to arrest the movement of the gear 36 and prevent sounding of the timer-alarm 14.

The homeowner or proprietor observing the lapse of a portion of the time may reset the timer-alarm 14 to allow the full delay period to be interposed after the next power failure.

Accordingly, it can be appreciated that the objects of the invention have been achieved by this arrangement in that a delay of considerable and selected duration may be built into the alarm system to cause activation of the alarm only after delay of sufficient duration to present a hazard and which may be tailored to the particular situation encountered by the user requiring protection. The device relies only on a mechanically-operated timer-alarm and may remain inactive between intervals of relatively great duration while remaining operative, inasmuch as the device does not depend on batteries which may fail over long periods of nonuse.

The extreme simplicity of this device is such that it may be manufactured at relatively low cost.

It is noted that the device may also be utilized as a conventional kitchen timer merely by unplugging the solenoid and releasing the lock and release lever to enable use of the device as a conventional timer.

Accordingly, during daytime hours when the power failure would be readily observed, the timer may be pressed into use in various kitchen or other applications and then plugged into the wall outlet for such use and continue to function as a power interruption monitor.

It should also be understood that while the use of a conventional timer results in the advantages described above, other timer-alarm devices could be employed.

The embodiments of the invention in which an exclusive property or privilege is claimed are defined as follows:

1. A delayed power interruption alarm for detecting an interruption of power in a circuit, said arrangement comprising:
   mechanical timer-alarm means, comprising: a spring-wound timer; means including an adjustment member selectively positionable to positions corresponding to a timed interval; and, an alarm activated to generate an alarm signal after a predetermined delay corresponding to said timed interval;
   electrical operator means adapted to be powered by said circuit, said electrical operator means including means normally preventing activation of said timer-alarm means as long as power is supplied from said circuit, and releasing said mechanical timer-alarm means upon cessation of the supply of power from said circuit, whereby an adjustable delay power failure alarm is provided.

2. The alarm according to claim 1 wherein said electrical operator means includes an electrical solenoid and means adapting said solenoid to be powered from an A.C. outlet including a power cord and plug, whereby an A.C. circuit may be monitored.

3. The alarm according to claim 2 wherein said electrical operator means further includes a lock and release lever operated by said electrical solenoid and means mounting said lever to be positioned in locking relationship with said timing alarm means whenever said electrical solenoid is energized by said circuit and moved to release said alarm means upon de-energization of said solenoid.

4. The alarm according to claim 3 wherein said electrical operator means includes means pivotally mounting said lock and release lever and further including spring bias means urging said lever to the timer-alarm released position.

* * * * *